(12) United States Patent
Kim et al.

(10) Patent No.: US 7,489,557 B2
(45) Date of Patent: Feb. 10, 2009

(54) METHODS FOR REDUCING WRITE TIME IN NONVOLATILE MEMORY DEVICES AND RELATED DEVICES

(75) Inventors: Sun-Kwon Kim, Gyeonggi-do (KR); Byeong-Hoon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 132 days.

(21) Appl. No.: 11/691,703

(22) Filed: Mar. 27, 2007

(65) Prior Publication Data
US 2008/0144392 A1   Jun. 19, 2008

(30) Foreign Application Priority Data
Dec. 13, 2006   (KR)   ...... 10-2006-0127264

(51) Int. Cl.
*G11C 11/03*   (2006.01)
(52) U.S. Cl. .............. 365/185.24; 365/185.14; 365/185.18; 365/185.29
(58) Field of Classification Search ........ 365/185.24, 365/185.14, 185.18, 185.29
See application file for complete search history.

(56) References Cited

U.S. PATENT DOCUMENTS 6,950,345 B1 *   9/2005   Tokiwa ............... 365/185.22
7,099,215 B1 *   8/2006   Rotenberg et al. .......... 365/204

FOREIGN PATENT DOCUMENTS

| KR | 1998-055967 | 9/1998 |
|---|---|---|
| KR | 100185611 B1 | 12/1998 |
| KR | 1020000062602 A | 10/2000 |
| KR | 1020010112099 A | 12/2001 |
| KR | 1020020094921 A | 12/2002 |
| KR | 1020030001611 A | 1/2003 |
| KR | 1020060002664 A | 1/2006 |

OTHER PUBLICATIONS

Notice of Allowance corresponding to Korean Patent Application No. 10-2006-0127264 mailed Nov. 30, 2007.

* cited by examiner

*Primary Examiner*—Pho M. Luu
(74) *Attorney, Agent, or Firm*—Meyers Bigel Sibley & Sajovec, PA (57) ABSTRACT

A method of operating a non-volatile memory device includes maintaining a write voltage at a predetermined voltage level for programming and/or erasing a memory cell of the non-volatile memory device during a time between execution of consecutive write operations. For example, the write voltage may be activated at the predetermined voltage level responsive to an initial write command, and discharge of the write voltage may be prevented responsive to a signal indicating consecutive write commands. Related devices are also discussed.

36 Claims, 6 Drawing Sheets

METHODS FOR REDUCING WRITE TIME IN NONVOLATILE MEMORY DEVICES AND RELATED DEVICES

CROSS-REFERENCE TO RELATED APPLICATIONS

This U.S. non-provisional patent application claims priority under 35 U.S.C. § 119 from Korean Patent Application No. 2006-127264 filed on Dec. 13, 2006, the disclosure of which is hereby incorporated by reference herein in its entirety.

FIELD OF THE INVENTION

The present invention relates to memory devices and related methods of operation, and more particularly, to nonvolatile memory devices and related methods of operation.

BACKGROUND OF THE INVENTION

Semiconductor memory devices may be classified as volatile and nonvolatile types, based on their ability to retain data therein without a power supply. Volatile memory devices may include static and dynamic random access memories, (i.e., SRAMs and DRAMs) while nonvolatile memory devices may include read-only memories (ROMs). ROMs may be of various types such as erasable and programmable ROMs (EPROMs), electrical EPROMs (EEPROMs), flash memories, and so on.

Nonvolatile memory devices may offer several advantages, as they may offer smaller sizes, lower power consumption, and/or advanced reading/writing performance. For example, flash memories may be used to provide on-chip memories for portable devices that may require relatively fast data updates, such as cellular phones, digital cameras, digital cameras, audio/video recorders, modems, smart cards, and so forth.

Figure 1:
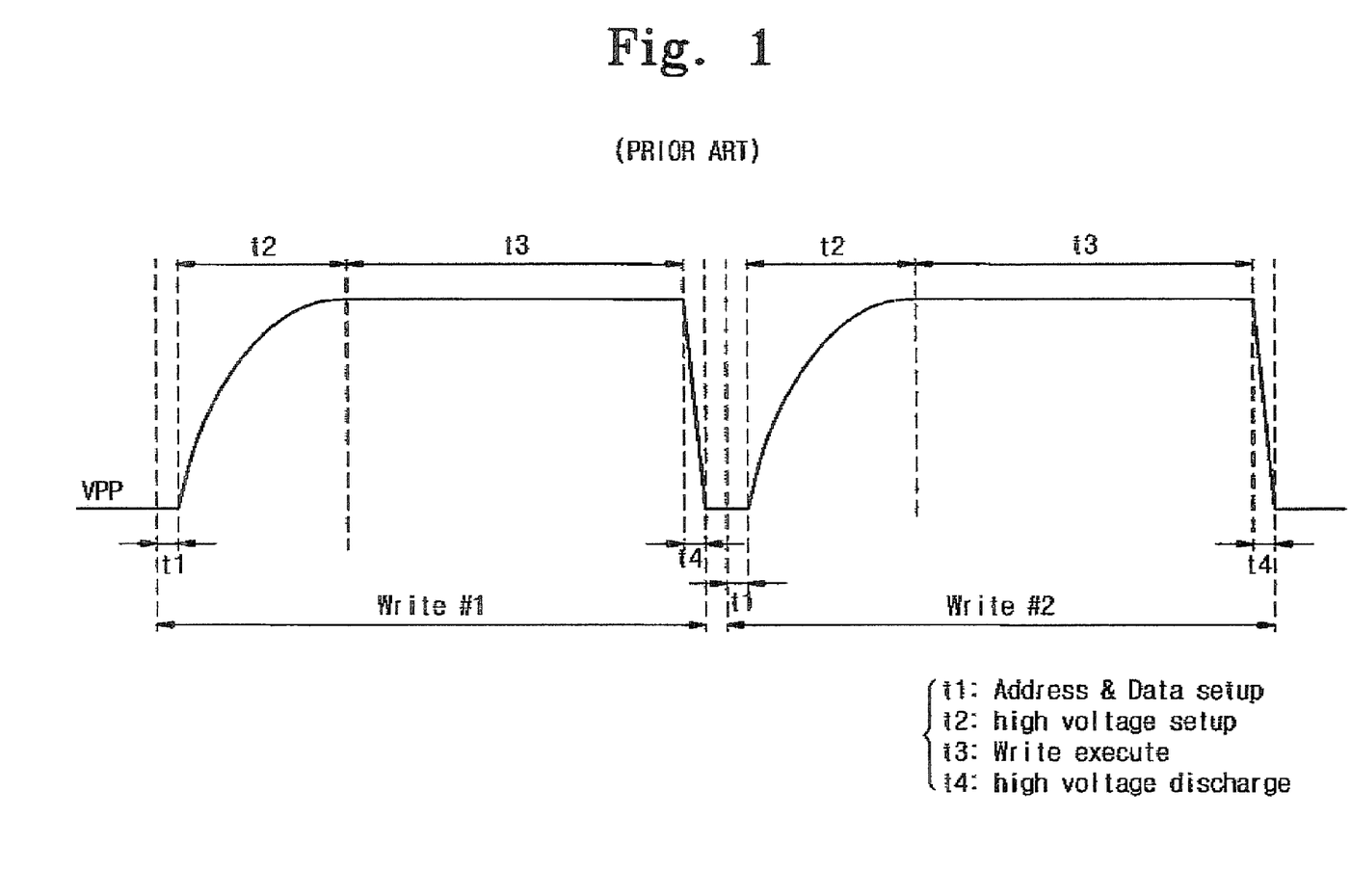
FIG. 1 is a diagram showing variation of a write voltage during a writing operation in a conventional nonvolatile memory device.

Some nonvolatile memory devices may need to be supplied with a voltage higher than a power source voltage, hereinafter, referred to as 'high voltage', for example, for writing operations by mechanisms of F-N tunneling, source-side channel hot electron injection, and so on. While the high voltage may be generated from the power source voltage, it may take time to generate the high voltage at a desired or target voltage level, also referred to herein as 'setup time'. Once the high voltage reaches the target level, it may be applied to a selected memory cell (or selected memory cells) for a predetermined time, also referred to herein as 'writing time'. A writing operation may include programming and erasing operations. After conducting a writing operation, the high voltage applied to a selected memory cell (or selected memory cells) may be discharged for a predetermined time, also referred to herein as 'discharge time'. FIG. 1 illustrates waveform variation of a high voltage during a writing operation as described above. As shown in FIG. 1, the aforementioned procedure, including a setup time, a writing time, and a discharge time, may be repeated if successive writing operations are performed.

Accordingly, as the amount of data to be successively written into a memory device and/or the number of successive writing cycles increases, managing the writing time may become increasingly important.

SUMMARY OF THE INVENTION

According to some embodiments of the present invention, a method of operating a non-volatile memory device includes maintaining a write voltage at a predetermined voltage level for programming and/or erasing a memory cell of the non-volatile memory device during a time between execution of consecutive write operations. In some embodiments, the write voltage may be activated at the predetermined voltage level responsive to an initial write command, and discharge of the write voltage may be prevented responsive to a signal indicating consecutive write commands.

According to other embodiments of the present invention, a method for writing data in a nonvolatile memory device may include activating a write acceleration enable signal in response to a signal indicating consecutive write commands; generating a write voltage responsive to the write acceleration enable signal and an initial write command; and continuously maintaining the write voltage at the predetermined voltage level during execution of the consecutive writing operations and times therebetween responsive to activation of the write acceleration enable signal.

In some embodiments, discharge of the write voltage may be prevented during the times between execution of the consecutive write operations responsive to activation of the write acceleration enable signal.

In other embodiments, the method may further include deactivating the write acceleration enable signal in response to a signal indicating an end of the consecutive write operations, and interrupting generation of the write voltage in response to the write acceleration enable signal.

In some embodiments, the consecutive write operations may include programming and/or erasing operations.

In other embodiments, the write voltage may be supplied to a source line of the non-volatile memory device when the consecutive write operations are programming operations.

In some embodiments, the write voltage may be supplied to a word line of the non-volatile memory device when the consecutive write operations are erasing operations.

In other embodiments, the signal indicating consecutive write commands may be a successive-writing start command.

In some embodiments, the signal indicating the consecutive write commands may be a flag signal provided from an external device.

In other embodiments, the method may further include detecting a command to write to a next page responsive to changes in addressing during execution of the consecutive write operations, interrupting the write voltage supplied to memory cells of a previous page responsive to detecting the command to write to the next page, storing at least a portion of the write voltage supplied to the memory cells of the previous page, discharging a remaining voltage from the memory cells of the previous page after storing the write voltage supplied to the memory cells of the previous page, and supplying the write voltage to memory cells of the next page along with the stored write voltage.

In some embodiments, the method may further include generating the write voltage for the consecutive write operations in response to the write acceleration enable signal and the writing command.

In other embodiments, the generation of the write voltage is interrupted when the write acceleration enable signal is deactivated.

In some embodiments, the write voltage is discharged when a last one of the consecutive write operations corresponding to the next page is terminated.

According to further embodiments of the present invention, a non-volatile memory device includes a plurality of memory cells and control logic block configured to maintain a write voltage at a predetermined voltage level for programming and/or erasing a memory cell of the non-volatile memory device during a time between execution of consecutive write operations. In some embodiments, the control logic block may be configured to prevent discharge of the write voltage responsive to a signal indicating consecutive write commands.

According to some embodiments of the present invention, a non-volatile memory device may include a memory cell array having a plurality of memory cells arranged in rows and columns, a voltage generator configured to generate a write voltage at a predetermined voltage level to be supplied to the memory cell array during execution of the consecutive write operations, and a control logic block configured to operate in response to a writing command and a signal indicating consecutive write operations. The control logic block may be configured to control the voltage generator to maintain the write voltage at the predetermined voltage level during execution of the consecutive write operations and times therebetween.

In still other embodiments of the present invention, a memory card includes a processing unit; a nonvolatile memory device controlled by the processing unit; and a register configured to store a flag bit indicating consecutive write operations under control of the processing unit. The nonvolatile memory device is configured to maintain a write voltage at a predetermined voltage level for programming and/or erasing a memory cell of the non-volatile memory device during a time between execution of the consecutive write operations based on the flag bit set in the register.

In some embodiments, the memory card may be a smart card.

DETAILED DESCRIPTION OF EMBODIMENTS OF THE INVENTION

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
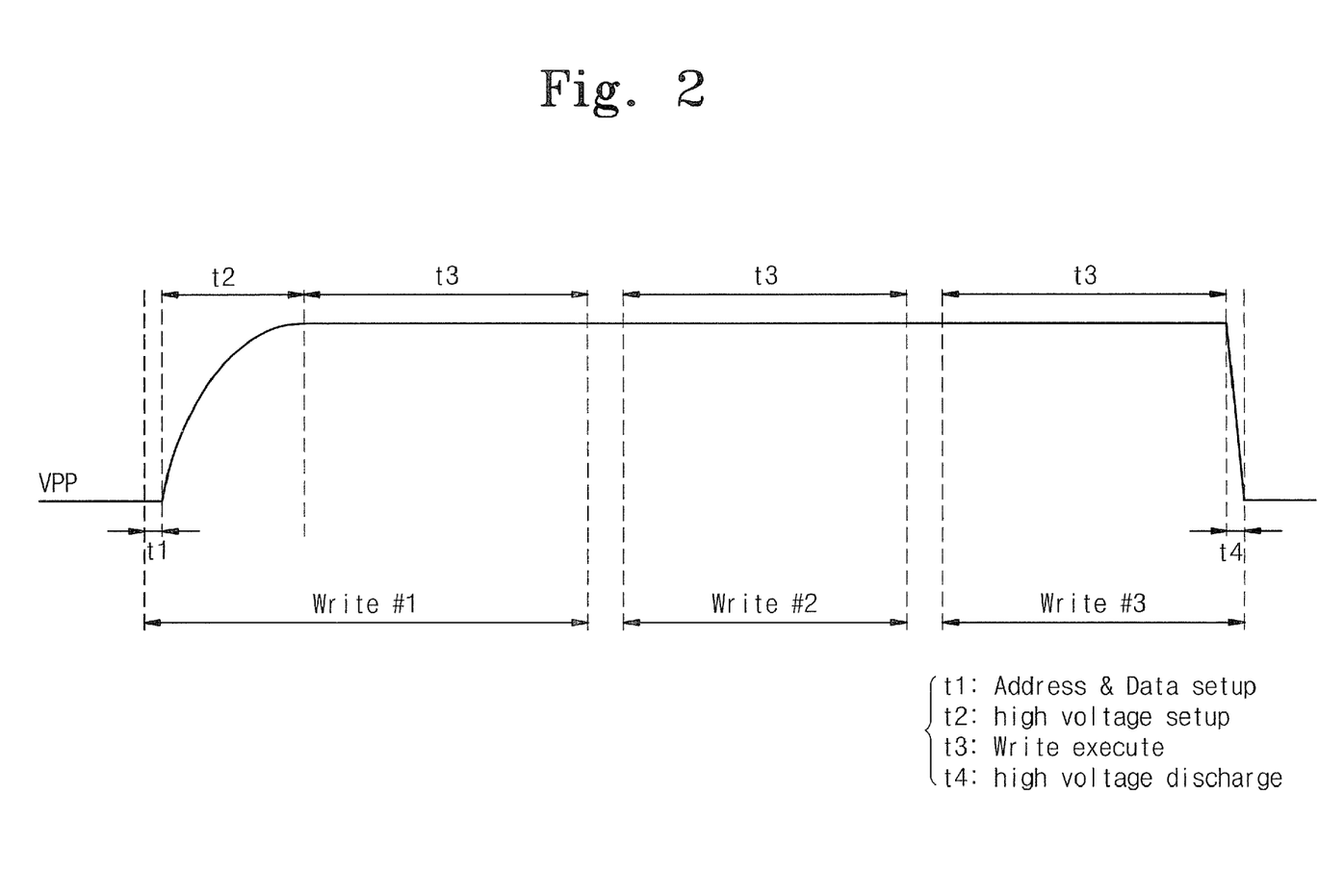
FIG. 2 is a diagram showing variation of a write voltage during a writing operation in a nonvolatile memory device according to some embodiments of the present invention.
Figure 3:
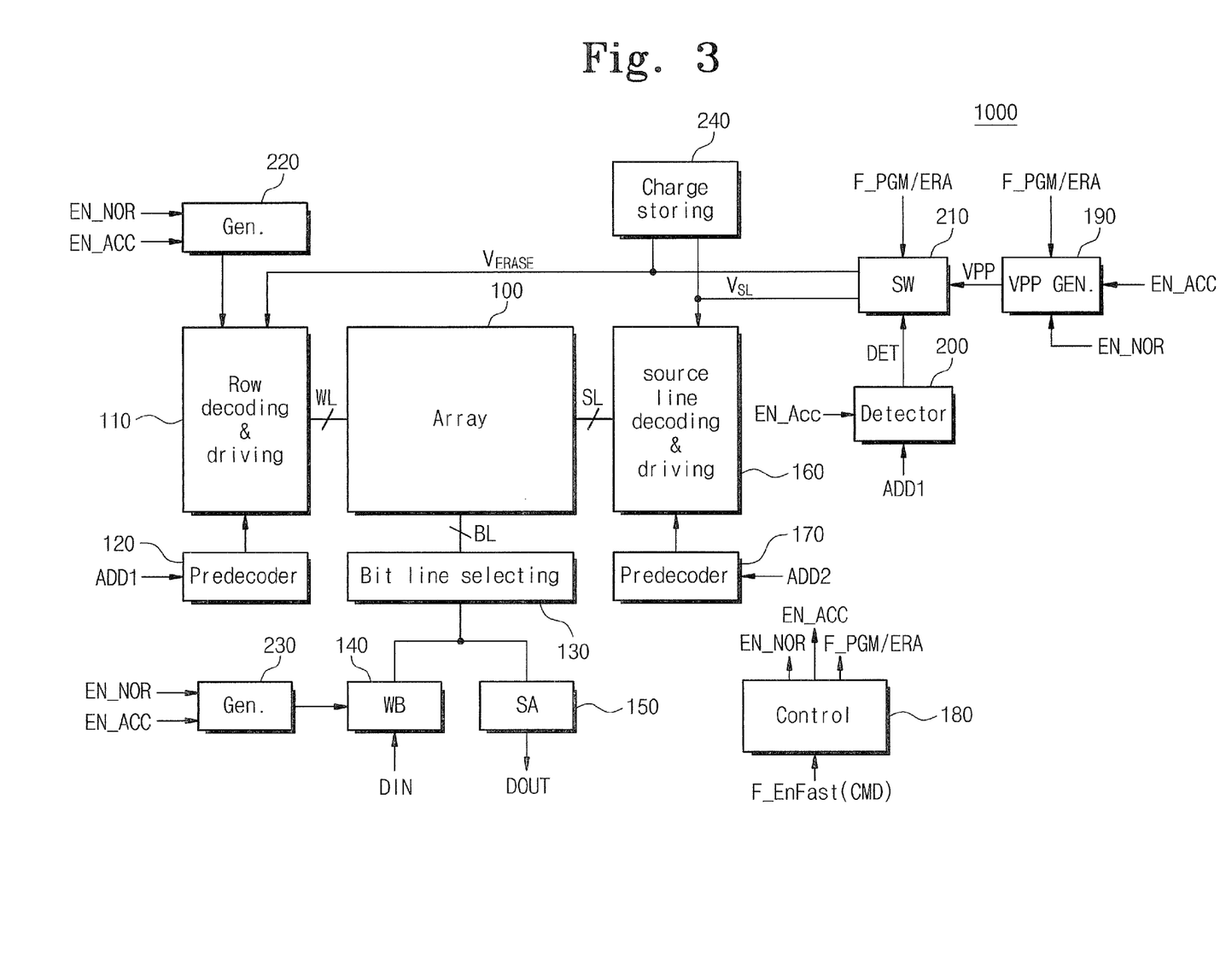
FIG. 3 is a block diagram illustrating a nonvolatile memory device in accordance with some embodiments of the present invention.

A nonvolatile memory device according to some embodiments of the present invention may be implemented to generate a high voltage for writing operations (also referred to herein as a write voltage) when there are consecutive or successive requests for a writing operation (also referred to herein as consecutive write commands) by an external system. As illustrated in FIG. 2, other than a setup time prior to the first writing operation and a discharge time after the last writing operation, the voltage VPP is maintained at a relatively constant level during one or more consecutive/successive writing operations. In other words, the write voltage is maintained at the "high" level during time periods between execution of consecutive write operations. Accordingly, if consecutive/successive write commands are issued by the external system, it may be possible to reduce a writing time of the nonvolatile memory device by shortening the setup time for generating the high voltage VPP and/or the discharge time of the high voltage VPP. FIG. 3 illustrates a nonvolatile memory device, which is controlled by such an operation scheme, in accordance with some embodiments of the present invention. The writing operations that may require the high voltage VPP described herein may include programming and erasing operations. The nonvolatile memory device according to some embodiments of the present invention may be a split-gate flash memory device including a control gate and a floating gate; however, embodiments of the present invention are not limited thereto. For instance, some embodiments of the present invention may be applicable to other kinds of nonvolatile memory devices, e.g., a NAND flash memory device, a NOR flash memory device, a phase-changeable RAM, and/or a magnetic RAM.

Referring to FIG. 3, the nonvolatile memory device 1000 has a memory cell array 100 storing N-bit data information (where N is a positive integer). The memory cell array 100 is composed of memory cells arranged in rows (i.e., wordlines) and columns (i.e., bit lines). Each memory cell may be formed of a split-gate flash memory cell that may be erased by a F-N tunneling mechanism and/or may be programmed by source-side channel hot electron injection; however, embodiments of the present invention are not limited to such a memory cell. A row decoding/driving circuit 110 selects and drives rows, i.e., word lines WL, of the memory cell array 100 in response to row address information provided from a pre-decoder circuit 120. A bit-line selection circuit 130 selects columns, i.e., bit lines BL, of the memory cell array 100 by a predetermined unit (e.g., byte, half-word, word) in response to column address information provided from the pre-decoder circuit 120. Selected bit lines are connected to a writing buffer circuit (WB) 140 during a writing operation and to a sense amplifier circuit (SA) 150 during a reading operation through the bit-line selection circuit 130. The bit-line selection circuit 130 may be configured to drive deselected bit lines with a power source voltage during a programming operation, and with a ground voltage during erasing and/or programming operations.

Still referring to FIG. 3, a source-line selection/drive circuit 160 selects and drives source lines SL of the memory cell array 100 in response to address decoding information provided from a pre-decoder circuit 170. A control logic block 180 is configured to control overall operation of the nonvolatile memory device 1000. In particular, the control logic 180 activates a write acceleration enable signal EN_ACC in response to an input of a writing command if a flag signal F_EnFast and/or a specific command (e.g., a successive-writing start command) is provided from an external device/system. The flag signal F_EnFast and/or the successive-writing start command may be used as a signal (i.e., information) indicating consecutive/successive writing operations. For instance, when the flash signal/successive-writing start command is provided, the write acceleration enable signal EN_ACC maintains its active state until the successive writing operation terminate. The control logic block 180 operates to activate a normal write enable signal EN_NOR when a writing command is input thereto without the flash signal F_EnFast or other specific command. The control logic block 180, for example, activates the normal write enable signal EN_NOR during a single writing operation. The write acceleration enable signal EN_ACC is activated in response to activation of the flag signal F_EnFast. Further, the write acceleration enable signal EN_ACC is deactivated in response to an input of a specific command (e.g., a successive-writing end command).

A high voltage generator 190 is controlled by the control logic block 180, and is configured to generate a high voltage VPP that may be used for a writing operation. In some embodiments, the high voltage generator 190 can be constructed by means of a pump and a regulator. The high voltage generator 190 operates to generate the high voltage VPP during an active period of the acceleration enable signal EN_ACC and/or the normal write enable signal EN_NOR. When a flag signal F_PGM/ERA is configured to indicate a programming operation, the high voltage generator 190 operates to generate the high voltage VPP as a source line voltage $V_{SL}$ (e.g., 9V) during an active period of the acceleration enable signal EN_ACC and/or normal write enable signal EN_NOR. When a flag signal F_PGM/ERA is configured to indicate an erasing operation, the high voltage generator 190 operates to generate the high voltage VPP as an erasing voltage $V_{ERASE}$ (e.g., 12V) during an active period of the write acceleration enable signal EN_ACC.

A detection circuit 200 is controlled by the write acceleration enable signal EN_ACC, and is configured to detect a change of page in response to an address ADD1 applied to the pre-decoder circuit 120. For instance, when the write acceleration enable signal EN_ACC is activated, the detection circuit 200 operates to detect, with reference to the address ADD1, whether a page selected in the previous writing operation is different from a page selected in a current writing operation. If a page selected in the previous writing operation is identical to a page selected in a current writing operation, the detection circuit 200 deactivates a detection signal DET. If a page selected in the previous writing operation is different from a page selected in a current writing operation, the detection circuit 200 activates the detection signal DET in the pattern of a pulse. A switch circuit 210 operates in response to the detection signal DET or the flag signal F_PGM/ERA, transferring the high voltage VPP as the source line voltage $V_{SL}$ and the erasing voltage $V_{ERASE}$. For instance, when the flag signal F_PGM/ERA indicates a programming operation, the switch circuit 210 outputs the high voltage VPP as the source line voltage $V_{SL}$ during an inactive period of the detection signal DET. When the flag signal F_PGM/ERA indicates an erasing operation, the switch circuit 210 outputs the high voltage VPP as the erasing voltage $V_{ERASE}$ during an inactive period of the detection signal DET. The switch circuit 210 interrupts the high voltage VPP to be output as the detection signal DET or the flag signal F_PGM/ERA.

A voltage generator 220 is controlled by the acceleration and normal enable signals EN_ACC and EN_NOR, and is configured to generate a voltage (e.g., VDD/1.2V) to be supplied to a selected word line during a reading or programming operation. A voltage generator 230 is also controlled by the acceleration and normal enable signals EN_ACC and EN_NOR, and is configured to generate a voltage (e.g., 0.7V) to be supplied to a selected bit line during a reading operation. In particular, the voltage generators 220 and 230 generate voltages corresponding to the reading or programming operation while the acceleration/normal enable signals EN_ACC/EN_NOR are activated. In other words, the voltage generators 220 and 230 maintain their operating conditions during an active period of the acceleration/normal enable signals EN_ACC/EN_NOR.

The nonvolatile memory device 1000 according to some embodiments of the present invention further includes a charge storing circuit 240 coupled to an output of the switch circuit 210. The charge storing circuit 240 operates in response to the detection signal DET of the detection circuit 200, and is configured to store charges (i.e., voltage) of a signal line that transfers the source line voltage $V_{SL}$ during a programming operation and/or the erasing voltage $V_{ERASE}$ during an erasing operation. For instance, in a successive writing operation, the charge storing circuit 240 stores charges of the signal line of $V_{SL}$ or $V_{ERASE}$ before a writing step for the next unit after completing a writing step for a predetermined unit. During this, the signal lines of $V_{SL}$ and $V_{ERASE}$ and the high voltage VPP are electrically isolated by the switch circuit 210. Charges, i.e., a voltage, stored in the charge storing circuit 240 are transferred to the signal line of $V_{SL}$ or $V_{ERASE}$ during the writing step for the next unit.

In some embodiments, the write acceleration enable signal EN_ACC may be applied to circuit components directly from an external device. That is, the write acceleration enable signal EN_ACC may not be generated by the control logic block 180. For example, in some embodiments, the control logic block 180 may not be provided with the successive/acceleration writing start command and/or the flag signal F_EnFast.

Accordingly, setup and/or discharge times for writing operations may be reduced by controlling the high voltage generator 190 to continuously generate the high voltage VPP during time periods between successive writing operations.

Figure 4:
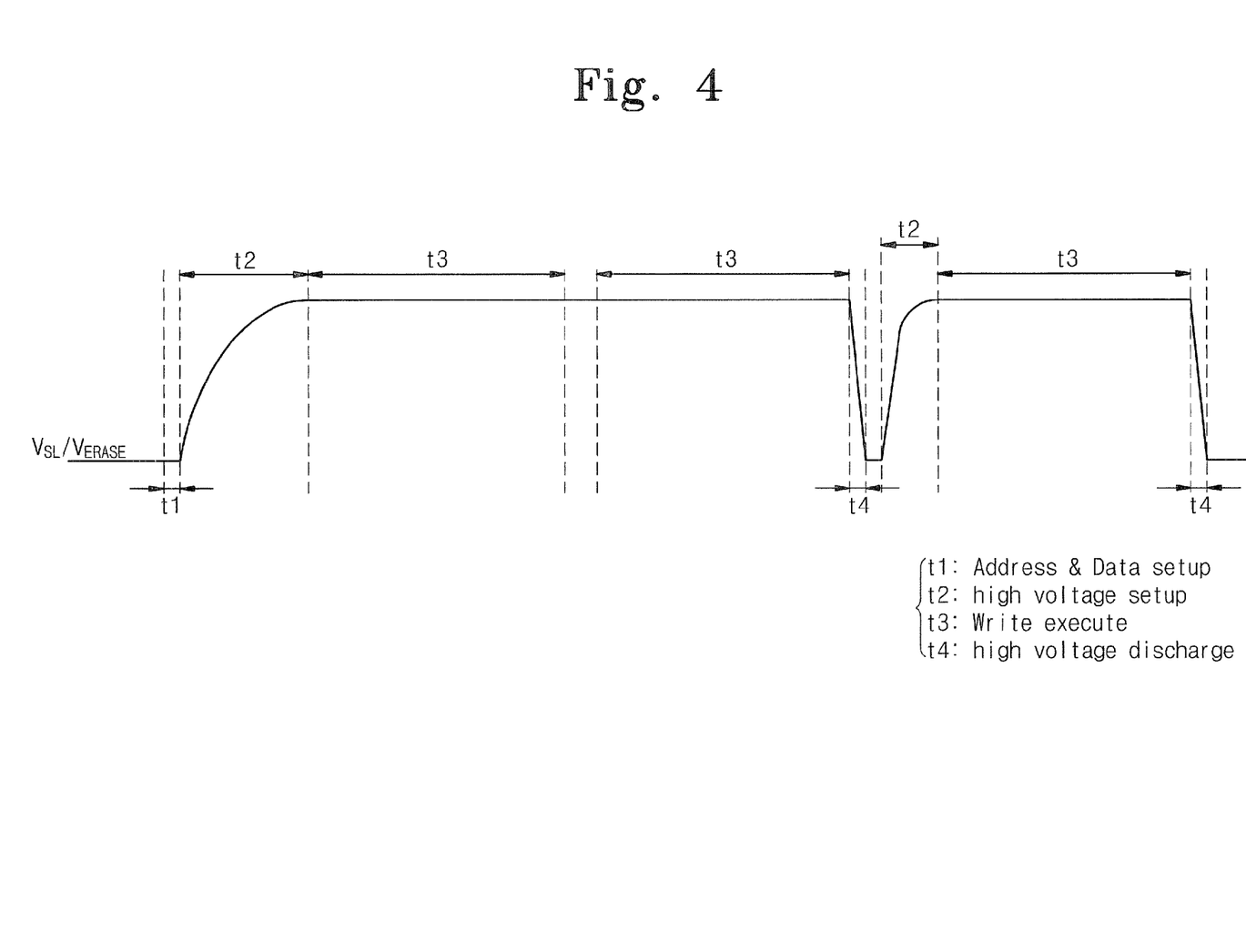
FIG. 4 is a diagram showing variations of a write voltage during a writing operation of the nonvolatile memory device shown in FIG. 3.

FIG. 4 shows variations in the source line voltage and the high voltage during consecutive/successive writing operations of the nonvolatile memory device shown in FIG. 3. As discussed above, a writing operation may include programming and/or erasing operations. For convenience of explanation, nonvolatile memory devices according to some embodiments of the present invention will be described below with reference to a programming operation.

For executing the programming operation, an address, data, and a writing command are provided to the nonvolatile memory device 1000 at predetermined times. Before applying the writing command thereto, the flash signal F_EnFast is activated to indicate the consecutive/successive programming operations. In some embodiments, the successive-writing start command is input to indicate the consecutive/successive programming operations. In this case, the control logic block 180 activates the write acceleration enable signal EN_ACC, instead of the normal write enable signal EN_NOR, in response to the successive-writing start command. Input data is loaded into the write buffer circuit 140 and an input address is provided to the pre-decoders 120 and 170. If there is no input of the flag signal or the successive-writing start command thereto, the control logic block 180 activates the normal write enable signal EN_NOR in response to the input writing command.

The row decoding/drive circuit 110 selects a word line in response to row address information provided from the pre-decoder circuit 120, and the bit-line selection circuit 130 selects bit lines in response to column address information provided from the pre-decoder 120. The source-line decoding/drive circuit 160 selects a source line corresponding to a selected word line in response to address information provided from the pre-decoder circuit 170. At the same time, the control logic block 180 generates the flag signal F_PGM/ERA, which indicates a programming operation, in response to the input writing command (e.g., a command instructing the programming operation).

Here, a unit word line is composed of a pair of odd and even word lines corresponding to a single source line. Memory cells coupled to the odd and even word lines and the source line form a unit page.

The high voltage generator 190 operates to generate the high voltage VPP in response to activation of the write acceleration enable signal EN_ACC and the flag signal F_PGM/ERA. The high voltage VPP reaches a target level during a setup time. During a programming operation, the high voltage VPP is provided at the source line voltage $V_{SL}$, e.g., 9V. The high voltage VPP is transferred to the source-line decoding/drive circuit 160 by way of the switch circuit 210. As a first programming operation is carried out, the detection signal DET of the detection circuit 200 is not activated. In addition, the voltage generators 220 and 230 generate corresponding voltages in response to activation of the write acceleration enable signal EN_ACC.

As described above, the source-line decoding/drive circuit 160 drives a selected source line at the source line voltage $V_{SL}$. The row decoding/drive circuit drives a selected word line at a voltage (e.g., 1.2V) supplied from the voltage generator 220. The write buffer circuit 140 drives bit lines, which are designated by the bit-line selection circuit 130, at a ground voltage in accordance with input data. Under such bias conditions, the input data is programmed into selected memory cells. Once the input data is programmed, the nonvolatile memory device 1000 informs an external system of an end of the programming operation.

According to nonvolatile memory devices of some embodiments of the present invention, although a programming operation with input data may be completed, the write acceleration enable signal EN_ACC continues to maintain its active state. As such the voltage generators, 190, 220, and 230, may continue to maintain their active states. Thus, as can be appreciated by FIGS. 2 and 4, the write voltage VPP is maintained at the "high" level, and is not discharged before the next writing step. Accordingly, responsive to receiving a consecutive write command, the next writing step (i.e., programming operation) to the same page is carried out in a similar manner as described above without discharging the high voltage VPP in conjunction with activation of the high voltage generator 190.

Figure 5:
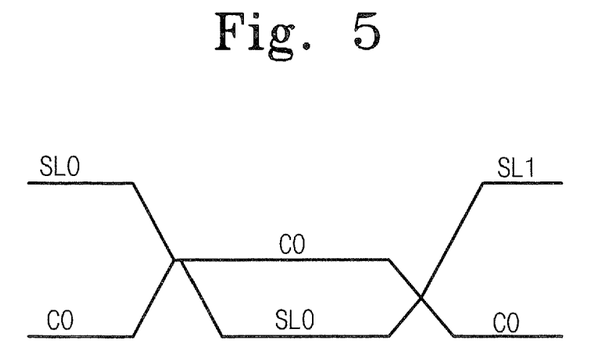
FIG. 5 is a waveform diagram showing voltage variations on a source line during the writing operation of the nonvolatile memory device shown in FIG. 3.

In some consecutive/successive writing operations, there may be a request for writing another page different from the previous page. As such, an address (e.g., ADD1) for selecting a page may be changed. When the address for selecting a page changes, the detection circuit 200 activates the detection signal DET with a pulse in response to the address ADD1 applied to the pre-decoder circuit 120. The switch circuit 210 interrupts output of the high voltage VPP in response to activation of the detection signal DET. In addition, the charge storing circuit 240 stores a voltage of the source line, i.e., the signal line of $V_{SL}$, belonging to the previous page in response to activation of the detection signal DET. The voltage set in the charge storing circuit 240 is denoted as 'C0' in FIG. 5. Next, as illustrated in FIG. 5, the source-line decoding/drive circuit 160 discharges a voltage (e.g., SL0) of the source line corresponding to the previous page. During this time, the charges or voltage of the source line may be stored for re-use by the charge storing circuit 240, i.e., not fully discharged therefrom. As a result, it may be possible to reduce power consumption. The source-line decoding/drive circuit 160 selects a source line (e.g., SL1) corresponding to the next page in response to address information provided from the pre-decoder 170. Then, as shown in FIG. 5, the selected source line SL1 is electrically connected to the charge storing circuit 240. In addition, an output of the high voltage generator 190, i.e., the high voltage VPP, is connected to the signal line of $V_{SL}$ by way of the switch circuit 210. As such, a charge sharing effect may be provided between the high voltage VPP and the signal line $V_{SL}$ connected to the source line. By driving the source line corresponding to the next page through the charge sharing effect, a time for setting up the high voltage VPP may be reduced, as shown in FIG. 4. The remaining consecutive/successive writing operations, according to some embodiments of the present invention, may be substantially similar to those described above and will not be further discussed herein.

In some embodiments of the present invention, the write acceleration enable signal EN_ACC enabled by activation of the flag signal F_EnFast may be deactivated in response to deactivation of the flag signal F_EnFast. Or, the write acceleration enable signal EN_ACC enabled by an input of the successive-writing start command may be deactivated in response to an input of the successive-writing end command. In response to deactivation of the write acceleration enable signal EN_ACC, the voltage generators 190, 220, and 230 may be disabled.

While some embodiments of the present invention may involve writing operations in a programming operation, it may be appreciated by those skilled in the art that embodiments of the present invention may also be applicable to erasing operations. For instance, in consecutively or successively executing an N-page erasing operation (where N is a positive integer), the erasing voltage $V_{ERASE}$ may be controlled in a similar manner to that of the source line voltage $V_{SL}$. Namely, if there is a request for a successive page erasing operation, the high voltage generator 190 may maintain its active state by the write acceleration enable signal EN_ACC until the successive page erasing operation is terminated. The write acceleration enable signal EN_ACC, as discussed above, is activated in response to an input of the flag signal F_EnFast and/or the successive-writing start command. As with the source line voltage $V_{SL}$, the charge sharing mode may be available for acceleration of the setup operation and/or reduction of current consumption. The erasing operation, according to some embodiments, may be carried out in the same procedure with a typical erasing operation, and will not be described further.

Figure 6:
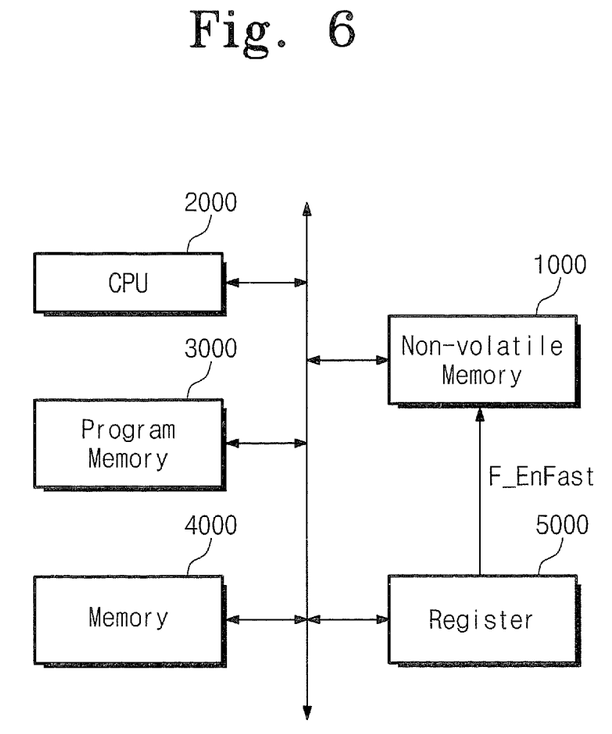
FIG. 6 is a block diagram of a memory card including a nonvolatile memory device according to some embodiments of the present invention.

FIG. 6 is a block diagram of a memory card including a nonvolatile memory device according to some embodiments of the present invention.

Referring to FIG. 6, the memory card according to some embodiments of the present invention includes a nonvolatile memory device 1000, a central processing unit (CPU) 2000 as a processing device, a program memory 3000, a memory 4000, and a register 5000. The nonvolatile memory device 1000 may be substantially similar to that shown in FIG. 3, and will not be further described herein. The CPU 2000 controls an overall operation of the memory card. The program memory 3000 is used to store a program file and the memory 4000 is used to store data to be stored in and/or read from the nonvolatile memory device 1000. The program memory 3000 and/or the memory 4000 may be implemented by volatile and/or nonvolatile random access memories respectively. The memories 3000 and 4000 may also be implemented in a single memory. The register 5000 is used to store the flag signal F_EnFast indicating the aforementioned successive writing operation. The flag signal F_EnFast is established by the CPU 2000.

Figure 7:
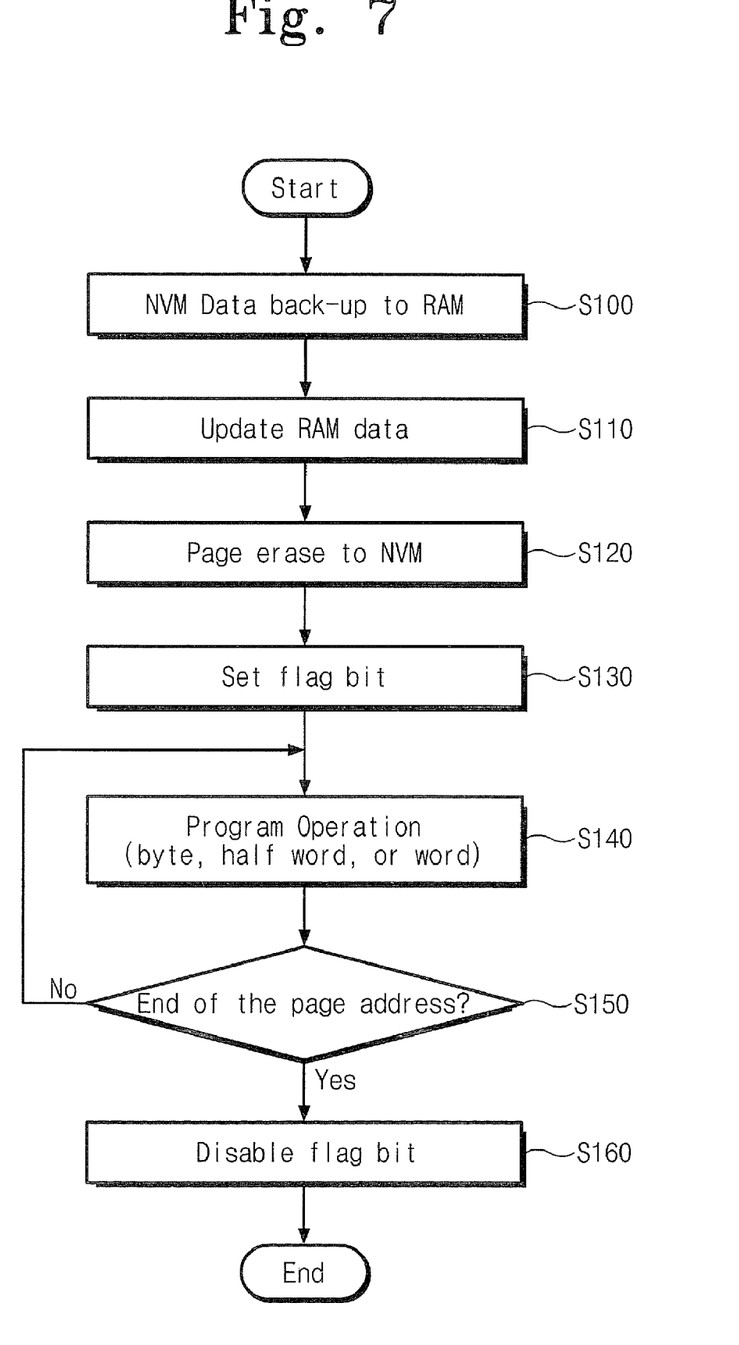
FIG. 7 is a flowchart illustrating writing operations in the memory card shown in FIG. 6.

FIG. 7 is a flowchart illustrating writing operations in the memory card shown in FIG. 6. For convenience, operations for partially updating data stored in the nonvolatile memory device will be described using a flag signal to inform the nonvolatile memory device of the successive writing operations; however, it will be appreciated by those skilled in the art that the aforementioned successive-writing start/end commands may also be used therein.

Referring to FIG. 7, when there is a request for partially updating data stored in the nonvolatile memory device 1000, page data including the data to be updated is backed up to the memory from the nonvolatile memory device 1000 in step S100. In step S110, data stored in the memory 4000 is partially updated with data provided, for example, from an external device. In step S1120, memory cells of the nonvolatile memory device 1000, belonging to the read page, are erased, for example, by a typical page erasing operation. Once a page erasing operation is completed, in a step S130, the CPU 2000 sets the register 5000 to indicate consecutive/successive writing operations. For instance, a bit of the flag signal F_EnFast may be set to logic '1' to represent the successive writing operations.

Then, the procedure goes to step S140 to partially transfer data (e.g., byte data, half-word data, and word data) to the nonvolatile memory device 1000 from the memory 4000. The flag signal F_EnFast established at the register 5000 is transferred to the nonvolatile memory device 1000 before the data transmission. The control logic block 180 of the nonvolatile memory device 1000 activates the write acceleration enable signal EN_VCC in response to the flag signal F_EnFast. This means that the voltage generators 190, 220, and 230 maintain their active states (i.e., maintain the write voltage at the predetermined voltage level) during the successive writing operations (see FIG. 3). A programming operation may similarly be carried out in the nonvolatile memory device 1000, as discussed above. Next, in step S150, the CPU 2000 determines, with reference to a page address, whether the page data of the memory 400 has been stored in the nonvolatile memory device 1000. If the page data of the memory 400 have not all been stored in the nonvolatile memory device 1000, the procedure returns to step S140. On the other hand, if the page data of the memory 400 have all been stored in the nonvolatile memory device 1000, the CPU 2000 controls the register 5000 to set the flag signal F_EnFast to logic '0' as an inactive state. As the flag signal F_EnFast is set to logic '0' as its inactive state, the nonvolatile memory device 1000 deactivates the write acceleration enable signal EN_ACC, resulting in deactivation of the voltage generators 190, 220, and 230 (see FIG. 3). Thereafter, the procedure is terminated.

While embodiments of the present invention are described above with reference to consecutive or successive writing operations with same-page data, they may also be used with other successive writing operations, for example, with data provided from external devices and/or stored in multiple pages.

In some embodiments of the present invention, the memory card shown in FIG. 7 may be a smart card. However, memory cards according to embodiments of the present invention are not limited thereto.

As described above, some embodiments of the present invention may reduce and/or shorten setup and discharge times of writing operations by controlling a high voltage generator to continuously generate the high voltage VPP responsive to requests for consecutive or successive writing operations. Thus, it may be possible to reduce writing times in nonvolatile memory devices. Moreover, it may also be possible to reduce writing times in memory cards including such nonvolatile memory devices.

While the present invention has been particularly shown and described with reference to preferred embodiments thereof, it will be understood by those skilled in the art that various changes in form and details may be made therein without departing from the spirit and scope of the invention as defined by the appended claims.

The invention claimed is:

1. A method of operating a non-volatile memory device, the method comprising:
   maintaining a write voltage at a predetermined voltage level for programming and/or erasing a memory cell of the non-volatile memory device during a time between execution of consecutive write operations.

2. The method of claim 1, wherein maintaining the write voltage comprises:
   activating the write voltage to the predetermined voltage level responsive to an initial write command; and preventing discharge of the write voltage responsive to a signal indicating consecutive write commands.

3. The method of claim 1, wherein maintaining the write voltage comprises:
activating a write acceleration enable signal responsive to a signal indicating consecutive write commands;
generating the write voltage at the predetermined voltage level responsive to an initial write command; and
continuously maintaining the write voltage at the predetermined voltage level during execution of the consecutive write operations and times therebetween responsive to activation of the write acceleration enable signal.

4. The method of claim 3, wherein continuously maintaining the write voltage comprises:
preventing discharge of the write voltage during the times between execution of the consecutive write operations responsive to activation of the write acceleration enable signal.

5. The method of claim 3, further comprising:
deactivating the write acceleration enable signal in response to a signal indicating an end of the consecutive write operations; and
interrupting generation of the write voltage in response to deactivation of the write acceleration enable signal.

6. The method of claim 3, wherein the signal indicating the consecutive write commands comprises a successive-writing start command.

7. The method of claim 3, wherein the signal indicating the consecutive write commands comprises a flag signal provided from an external device.

8. The method of claim 3, further comprising:
detecting a command to write to a next page responsive to changes in addressing during execution of the consecutive write operations;
interrupting the write voltage supplied to memory cells of a previous page responsive to detecting the command to write to the next page;
storing at least a portion of the write voltage supplied to the memory cells of the previous page;
discharging a remaining voltage from the memory cells of the previous page after storing the write voltage supplied to the memory cells of the previous page; and
supplying the write voltage to memory cells of the next page along with the stored write voltage.

9. The method of claim 8, wherein generating the write voltage further comprises:
generating the write voltage responsive to the write acceleration enable signal and the initial write command.

10. The method of claim 9, further comprising:
interrupting generation of the write voltage when the write acceleration enable signal becomes inactive.

11. The method of claim 9, further comprising:
discharging the write voltage when a last one of the consecutive write operations corresponding to the next page is terminated.

12. The method of claim 1, wherein the consecutive write operations comprise programming and/or erasing operations.

13. The method of claim 12, further comprising:
supplying the write voltage to a source line of the non-volatile memory device when the consecutive write operations are programming operations.

14. The method of claim 12, further comprising:
supplying the write voltage to a word line of the non-volatile memory device when the consecutive write operations are erasing operations.

15. A non-volatile memory device, comprising:
a plurality of memory cells; and
a control logic block configured to maintain a write voltage at a predetermined voltage level for programming and/or erasing a memory cell of the non-volatile memory device during a time between execution of consecutive write operations.

16. The device of claim 15, wherein the control logic block is further configured to prevent discharge of the write voltage responsive to a signal indicating consecutive write commands.

17. The device of claim 16, wherein the plurality of memory cells comprise a memory cell array including the plurality of memory cells arranged in rows and columns, and further comprising:
a voltage generator configured to generate the write voltage at the predetermined voltage level to be supplied to the memory cell array during the consecutive write operations,
wherein the control logic block is configured to control the voltage generator to maintain the write voltage at the predetermined voltage level during execution of the consecutive write operations and times therebetween.

18. The device of claim 17, wherein the signal indicating consecutive write commands comprises a flag signal provided from external device.

19. The device of claim 18, wherein the control logic block is configured to activate a write acceleration enable signal responsive to the flag signal, and wherein the voltage generator is configured to maintain the write voltage at the predetermined voltage level responsive to activation of the write acceleration enable signal.

20. The device of claim 19, wherein the control logic block is configured to deactivate the write acceleration enable signal responsive to deactivation of the flag signal, and wherein the voltage generator is configured to interrupt generation of the write voltage responsive to deactivation of the write acceleration enable signal.

21. The device of claim 17, wherein the signal indicating the consecutive write commands comprises a successive-writing start command.

22. The device of claim 21, wherein the control logic block is configured to activate a write acceleration enable signal responsive to the successive-writing start command, and wherein the voltage generator is configured to maintain the write voltage at the predetermined voltage level responsive to activation of the write acceleration enable signal.

23. The device of claim 22, wherein the control logic block is configured to deactivate the write acceleration enable signal in response to a successive-writing end command, and wherein the voltage generator is configured to interrupt generation of the write voltage responsive to deactivation of the write acceleration enable signal.

24. The nonvolatile memory as set forth in claim 17, further comprising:
a detection circuit configured to detect a command to write to a next page responsive to changes in addressing during execution of the consecutive write operations and activate a detection signal responsive to the detection.

25. The device of claim 24, further comprising:
a switch circuit configured to provide the write voltage as an erasing voltage and/or a source line voltage during the consecutive write operations and configured to interrupt output of the write voltage to the memory cell array during activation of the detection signal.

26. The device of claim 25, further comprising:
a charge storing circuit connected to an output of the switch circuit and configured to store at least a portion of the write voltage supplied to the memory cell array responsive to the detection signal.

27. The device of claim 26, wherein the switch circuit is configured to output the write voltage to the memory cell array responsive to deactivation of the detection signal.

28. The device of claim 27, which further comprises:
a first voltage generator configured to be controlled by the control logic block, and configured to generate a first voltage to be supplied to a row of the memory cell array; and
a second voltage generator configured to be controlled by the control logic block, and configured to generate a second voltage to be supplied to a column of the memory cell array,
wherein the control logic block is configured to control the first and second voltage generators to maintain active states during execution of the consecutive write operations.

29. The device of claim 28, wherein the control logic block is configured to discharge the write voltage when a last one of the consecutive writing operations is terminated.

30. The device of claim 29, wherein the control logic block is further configured to discharge the write voltage responsive to detection of the command to write to the next page.

31. The device of claim 17, wherein the control logic block is configured to activate a normal write enable signal responsive to input of a write command without the signal indicating the consecutive write commands, and wherein the voltage generator is configured to generate the write voltage during activation of the normal write enable signal.

32. The device of claim 31, wherein the control logic block is configured to deactivate the normal write enable signal when a writing operation corresponding to the write command is terminated.

33. The device claim 17, wherein the control logic block is configured to generate a write command and the signal indicating the consecutive write commands and activate a write acceleration enable signal responsive to the signal indicating the consecutive write commands, and wherein the voltage generator is configured to maintain the write voltage at the predetermined voltage level during execution of the consecutive write operations responsive to activation of the write acceleration enable signal.

34. A memory card comprising:
a processing unit;
a non-volatile memory device controlled by the processing unit; and
a register configured to store a flag bit indicating consecutive write operations under control of the processing unit,
wherein the non-volatile memory device is configured to maintain a write voltage at a predetermined voltage level for programming and/or erasing a memory cell of the non-volatile memory device during a time between execution of the consecutive write operations based on the flag bit set in the register.

35. The memory card of claim 34, wherein the processing unit is configured to set the flag bit of the register to an active state responsive to a request for the consecutive write operations.

36. The memory card of claim 34, wherein the processing unit is configured to set the flag bit of the register in an inactive state responsive to an end of the consecutive write operations.

* * * * *